(12) United States Patent
Ajuria et al.

(10) Patent No.: US 9,548,266 B2
(45) Date of Patent: Jan. 17, 2017

(54) SEMICONDUCTOR PACKAGE WITH EMBEDDED CAPACITOR AND METHODS OF MANUFACTURING SAME

(71) Applicants: Sergio A. Ajuria, Austin, TX (US); Phuc M. Nyugen, Austin, TX (US); Douglas M. Reber, Austin, TX (US)

(72) Inventors: Sergio A. Ajuria, Austin, TX (US); Phuc M. Nyugen, Austin, TX (US); Douglas M. Reber, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/469,645

(22) Filed: Aug. 27, 2014

(65) Prior Publication Data

US 2016/0064324 A1    Mar. 3, 2016

(51) Int. Cl.
*H01L 23/522* (2006.01)
*H01L 49/02* (2006.01)

(52) U.S. Cl.
CPC ........... *H01L 23/5223* (2013.01); *H01L 28/60* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,271,084 B1 | 8/2001 | Tu et al. | |
| 6,461,914 B1 | 10/2002 | Roberts et al. | |
| 6,720,232 B1 | 4/2004 | Tu et al. | |
| 7,329,958 B1 | 2/2008 | Shah | |
| 7,391,110 B2 | 6/2008 | Cornelius | |
| 7,919,860 B2 | 4/2011 | Murugan et al. | |
| 8,288,240 B2 | 10/2012 | Booth, Jr. et al. | |
| 2003/0197215 A1 | 10/2003 | Coolbaugh et al. | |
| 2009/0004807 A1* | 1/2009 | Chen | H01L 23/5223 438/381 |
| 2013/0037910 A1 | 2/2013 | Tzeng et al. | |
| 2013/0175666 A1 | 7/2013 | Tran et al. | |
| 2013/0234288 A1 | 9/2013 | Gu et al. | |
| 2015/0270233 A1* | 9/2015 | Vincent | H01L 24/02 257/773 |

* cited by examiner

*Primary Examiner* — Shaun Campbell
*Assistant Examiner* — Aneta Cieslewicz

(57) ABSTRACT

A semiconductor package with an embedded capacitor and corresponding manufacturing methods are described. The semiconductor package with the embedded capacitor includes a semiconductor die having a first metal layer extending across at least a portion of a first side of the semiconductor die and a package structure formed on the first side of the semiconductor die. A first electrical conductor of the embedded capacitor is formed in the first metal layer of the semiconductor die. The package structure includes a second metal layer that has formed therein a second electrical conductor of the embedded capacitor. A dielectric of the embedded capacitor is positioned within either the semiconductor die or the package structure of the semiconductor package to isolate the first electrical conductor from the second electrical conductor of the embedded capacitor.

5 Claims, 7 Drawing Sheets

SEMICONDUCTOR PACKAGE WITH EMBEDDED CAPACITOR AND METHODS OF MANUFACTURING SAME

FIELD

The present disclosure relates generally to semiconductor devices and more particularly to a semiconductor package with an embedded capacitor and methods of manufacturing same.

BACKGROUND

As electronic devices become more powerful, they require increasingly fast switching interfaces for some of the transistors on one or more semiconductor die within the electronic devices. Voltage irregularities associated with these faster switching interfaces can create noise that adversely impacts the functioning of the electronic devices. For instance, there may be a voltage spike or a voltage dip, also referred to in the art as supply bounce, with either a power supply rail or a ground supply rail that powers the transistors on the semiconductor die. If ignored, this power supply bounce or ground supply bounce can, for instance, adversely impact data integrity.

Including decoupling capacitance on the semiconductor die between the power and ground supply rails has been one solution for dampening noise resulting from bouncing of the voltage supply rails. This solution has been so effective in noise reduction that there is a general desire to add as much decoupling capacitance on the semiconductor die as possible. Unfortunately, adding decoupling capacitance often utilizes large amounts of space on a semiconductor die at the expense of other components on the die, such as memory and processing components, which correspondingly increases cost.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

Figure 1:
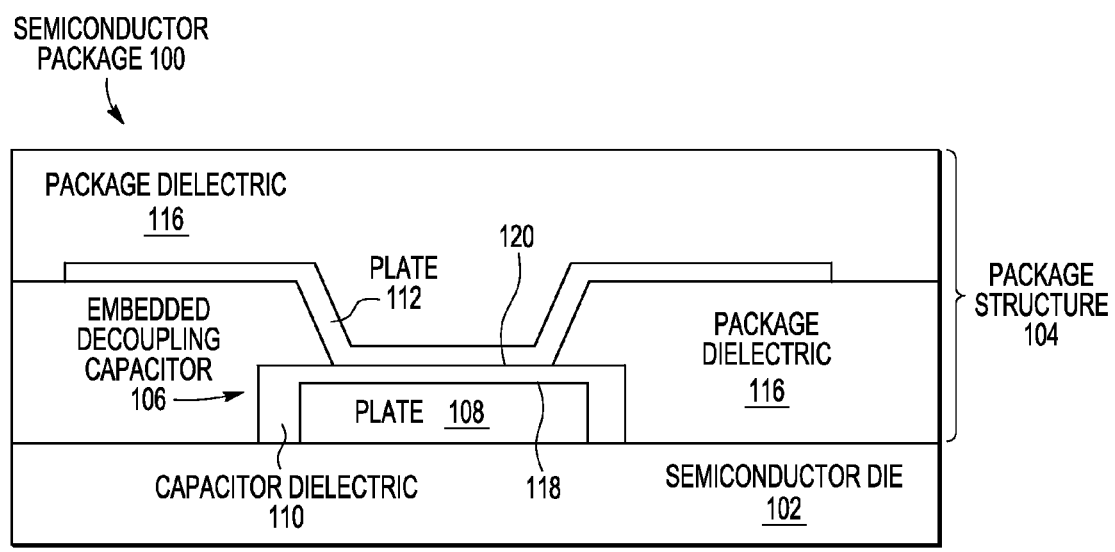
FIG. 1 is a cross-sectional view of a partial semiconductor package with an embedded capacitor, in accordance with an embodiment.

Embodiments of the present disclosure are illustrated by way of example and are not limited by the accompanying figures, in which like reference numbers indicate similar elements. Skilled artisans will appreciate that elements in the figures are illustrated for simplicity and clarity and have not necessarily been drawn to scale. For example, the dimensions of some elements in the figures may be exaggerated relative to other elements to help to improve understanding of the embodiments.

The apparatus and method components have been represented where appropriate by conventional symbols in the drawings, showing only those specific details that are pertinent to understanding the embodiments, so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with embodiments is a semiconductor package with at least one embedded capacitor and methods for manufacturing the same. By using the teachings herein, decoupling capacitance can be added to a semiconductor package, having a semiconductor die with a package structure formed thereon, using areas of the semiconductor die that are not otherwise utilized. Accordingly, the amount of decoupling capacitance included on the die can be maximized without decreasing the number of other components on the die. With some embodiments, this illustrative advantage can be realized with only a minimal increase in semiconductor processing steps used to manufacture the semiconductor package.

FIG. 1 is a cross-sectional view of a semiconductor package 100 that includes an embedded capacitor in accordance with an embodiment. The semiconductor package 100 includes a semiconductor die 102 having built or formed thereon a package structure 104, which includes at least one metal layer, e.g., from which an element 112 is formed, and a package dielectric 116 that surrounds the at least one metal layer. The semiconductor package 100 further includes an embedded capacitor 106, which is embedded into both the semiconductor die 102 and the package structure 104 of the semiconductor package 100. An embedded element or component, such as an embedded capacitor, means that the element or component is integrally formed into a semiconductor device, such as the semiconductor package 100, using process steps that are part of the semiconductor device fabrication process. The embedded capacitor is a "vertically stacked" or a "stacked" capacitor meaning that at least a portion of each of its plates and its dielectric are formed from multiple distinct vertically adjacent layers of material that are formed one on top of the other. In one example embodiment, the embedded capacitor 106 is a MIM (metal-insulator-metal) capacitor used to provide decoupling capacitance within the semiconductor package 100. However, the present teachings are not limited as such and can be used to implement one or more embedded capacitors into a semiconductor device for any suitable purpose.

As shown in FIG. 1, one electrical conductor 108, referred to in the drawing as a plate 108, of the embedded capacitor 106 is embedded into the semiconductor die 102. Another electrical conductor or plate 112 of the embedded capacitor 106 is embedded into the package structure 104. A capacitor dielectric 110 of the embedded capacitor 106 separates and provides electrical isolation between the plates 108 and 112. As shown, the capacitor dielectric 110 completely covers the plate 108. However, in an alternative implementation where the size of the plate 112 is comparable to the size of the plate 108, the capacitor dielectric 110 may extend only between a top portion 118 of plate 108 and a bottom portion 120 of plate 112. The capacitor dielectric 110 can be embedded into the semiconductor package 100 during either the semiconductor die manufacturing process or during a package build-up process, as described later.

Figure 2:
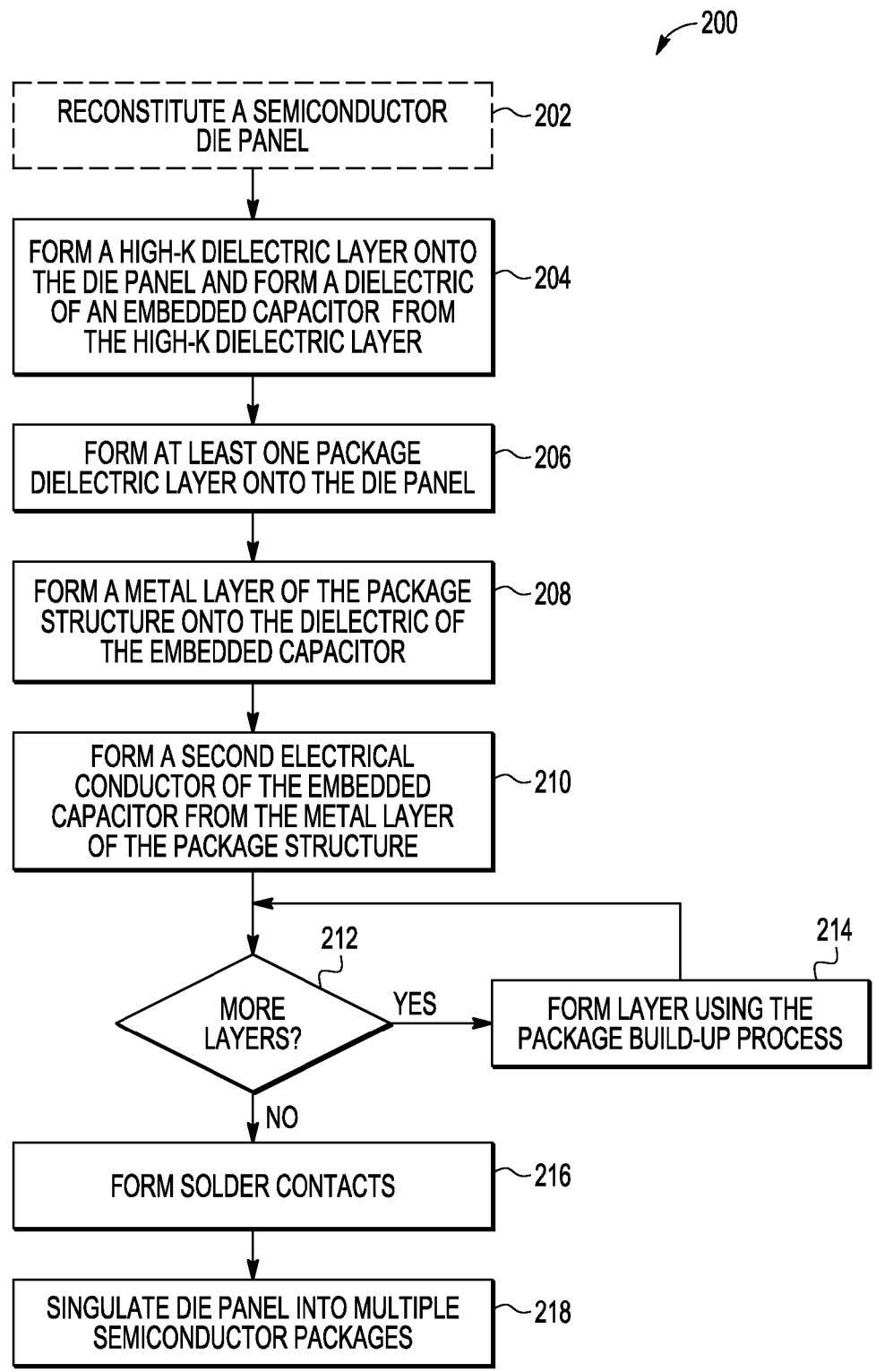
FIG. 2 is a flow diagram illustrating a method of manufacturing a semiconductor package with an embedded capacitor, such as the one shown in FIG. 1, in accordance with an embodiment.

FIG. 2 illustrates a flow diagram for a method 200 of manufacturing a semiconductor package with an embedded capacitor, in accordance with an embodiment. In a particular implementation scenario, method 200 is used to manufacture the semiconductor package 100 having the embedded capacitor 106, shown in FIG. 1. Accordingly, the method 200 uses or is incorporated into a package build-up process to form the layers of the package structure 104 onto the semiconductor die 102. In one embodiment, the layers of the package structure 104, including the package dielectric 116 and the metal layer used to create portions of the embedded capacitor 106, are formed as part of a wafer level package build-up process. In a wafer level package build-up process, a package structure is formed on each of multiple semiconductor die in a semiconductor die panel.

For a particular embodiment, the package structures are formed onto a wafer of multiple die before the wafer is singulated or cut into multiple individual die; and an area in which interconnects are formed are coincident with an area of the die, which results in a fan-in design. In such an embodiment, the method 200 of manufacturing a semiconductor package begins at functional block 204.

For another embodiment, the wafer level package build-up process is a fan-out wafer level package build-up process that allows for a single or for multiple metal layers. In this embodiment, the method 200 of manufacturing a semiconductor package begins at functional block 202. More particularly, in a fan-out wafer level package build-up process, the package structures are formed onto a reconstituted semiconductor die panel having a plurality of semiconductor die, where an area in which interconnects are formed extends beyond an area of the die, which results in a fan-out design. A reconstituted semiconductor die panel, for purposes of the present teachings, means an artificial wafer formed from a plurality of singulated die and a casting compound, wherein the artificial wafer includes the fan-out area that extends beyond the outer edges of the semiconductor die.

For yet another embodiment, the method 200 is used on a die by die basis, meaning a slightly modified version of functional blocks 204-216 of the method 200 is used to build a package structure onto a single die and, thereby, embed a capacitor into a resulting single semiconductor package.

Method 200 is described herein for the embodiment where the semiconductor package manufacturing process is incorporated into a fan-out wafer level package build-up process to manufacture the semiconductor package 100 shown in FIG. 1. However, as mentioned above, the implementation of method 200 is not limited as such. In this described embodiment, the semiconductor die 102 is one of a plurality of semiconductor die embedded in a reconstituted semiconductor die panel.

Figure 3:
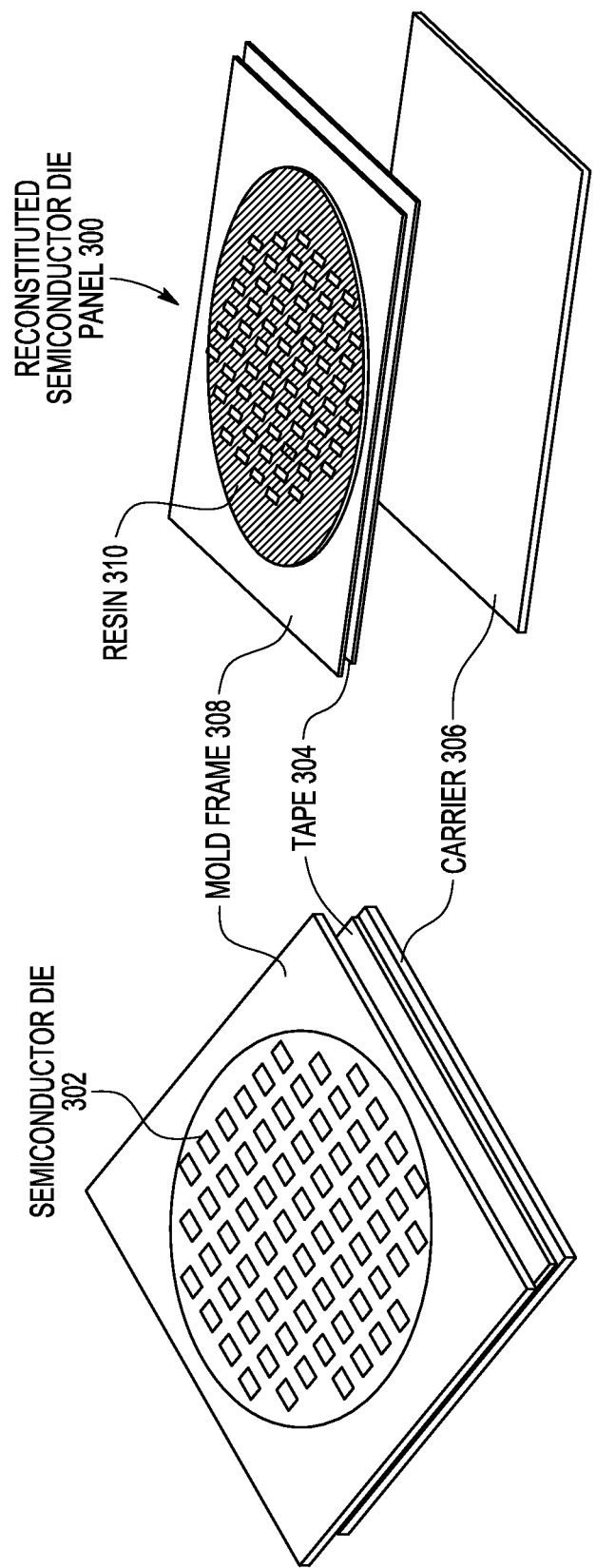
FIG. 3 is an exploded view illustrating forming a reconstituted semiconductor die panel in order to manufacture a semiconductor package with an embedded capacitor, in accordance with an embodiment.

FIG. 3 illustrates an exploded view of forming a reconstituted semiconductor die panel 300 in order to manufacture a semiconductor package with an embedded capacitor. Singulated semiconductor die, one of which is labeled 302, are placed face down in a "flip-chip" configuration on an adhesive tape 304. The adhesive tape 304 sits on a carrier 306 that provides structural support for forming the artificial wafer 300. In a particular embodiment, the singulated die 302 are first tested before being used to construct the artificial wafer 300. A mold frame 308 is placed on top of the structure and a casting compound 310, such as a resin material, is poured inside the mold frame 308. After curing, the mold frame 308 and tape 304 are removed leaving the reconstituted semiconductor die panel 300 upon which the package structure layers are formed, continuing with block 204 of method 200.

According to method 200, a dielectric layer is formed 204 onto the semiconductor die panel such as through a deposition technique. A dielectric of an embedded capacitor, e.g., capacitor dielectric 110, is formed, fashioned, or otherwise shaped from the dielectric layer, for instance through a patterning and etching procedure. This results in the capacitor dielectric 110 being positioned vertically adjacent to the electrical conductor or plate 108 of the embedded capacitor 106, which, as mentioned above, is formed from a metal layer of the semiconductor die 102. In an embodiment, a conventional package build-up process is modified to add a process step corresponding to functional block 204. Accordingly, in this embodiment, the capacitor dielectric 110 of the embedded capacitor 106 is formed from a dielectric layer of the package structure 104.

In the example shown, the capacitor dielectric 110 completely surrounds the plate 108 to maximize isolation between the two plates of the embedded capacitor 106. Moreover, in a particular embodiment, the capacitor dielectric 110 is formed using a high-k dielectric material, wherein "high-k" means a dielectric constant (k) greater than that of silicon dioxide, which has a k of 3.9. The high-k dielectric material enables a greater capacitance than a low-k dielectric material having the same thickness in a given area. Examples of high-k dielectric materials include, but are not limited to, Tantalum Nitride (TaN), Titanium Nitride (TiN), hafnium oxide ($HfO_2$), Silicon Nitride ($Si_3N_4$), Aluminum Oxide ($Al_2O_3$), Hafnium Oxide ($HfO_2$), Aluminum Nitride (AlN), and Boron Nitride (BN), which can be deposited using atomic layer deposition and etched to form the capacitor dielectric 110.

The package build-up process 200 continues with forming 206 at least one additional dielectric layer onto the semiconductor die panel to provide the package dielectric, e.g., 116 of FIG. 1, within each package structure. The package dielectric 116 protects the semiconductor die 102 and provides electrical isolation between metal layers and/or metal interconnects within the package structure 104. Since integrated circuits are typically not constructed within the package structure 104, in one embodiment, the package dielectric 116 is formed from a low-k dielectric material, wherein "low-k" means a dielectric constant less than that of silicon dioxide.

A metal layer of the package structure 104, also referred to herein as a "second" metal layer, is formed 208 on the capacitor dielectric 110 and formed on and/or embedded in the package dielectric 116, in one embodiment. When the method 200 is incorporated into a package build-up process, and more particularly a fan-out wafer level build-up process having multiple metal layers, this second metal layer can be an initially-formed metal layer of the package build-up process. As used herein, an initially-formed metal layer of a package build-up process is the metal layer within the resulting package structure that is closest to the semiconductor die. In an embodiment, this metal layer includes or is made up of copper. The electrical conductor or plate 112, also referred to herein as a "second" electrical conductor, of the embedded capacitor 106 is formed 210 from the second metal layer (e.g., the initially-formed metal layer) of the package structure 104.

In a particular embodiment, forming the second electrical conductor from the second metal layer of the package structure includes forming a second landing member and a pair of extension members from the second metal layer. The pair of extension members connect the second landing member to a pair of voltage pads formed in the first metal layer of the semiconductor die. Forming the second landing member and the pair of extension members in the second metal layer, and connecting the pair of extension members to the pair of voltage pads can be performed in a single metallization step of the package build-up process. Resultantly, the second landing member is positioned to overlap a first landing member of the first electrical conductor of the embedded capacitor; and the dielectric of the embedded capacitor is positioned between the first and second landing members. Variations of this embodiment are illustrated by reference to FIGS. 4-6.

Figure 5:
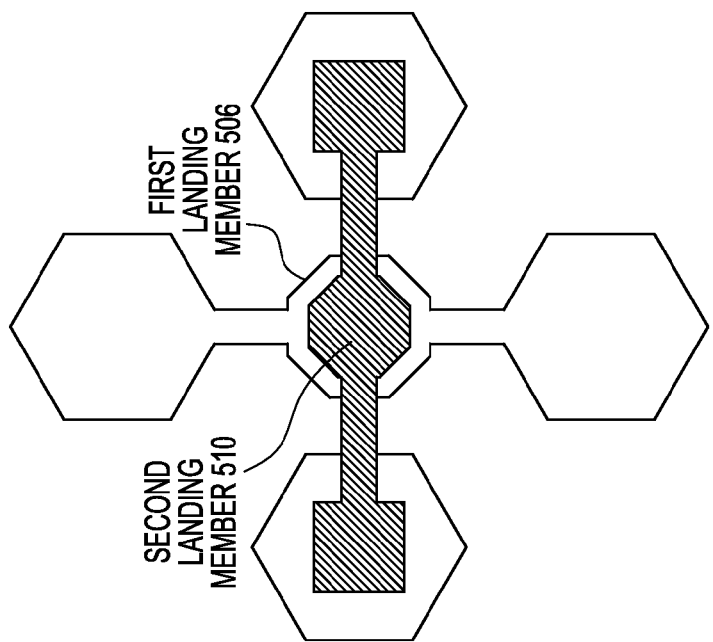
FIGS. 4-6 are top-down views illustrating forming a second electrical conductor of an embedded capacitor while forming a package structure on a semiconductor die that includes a first electrical conductor of the embedded capacitor, in accordance with an embodiment.
Figure 4:
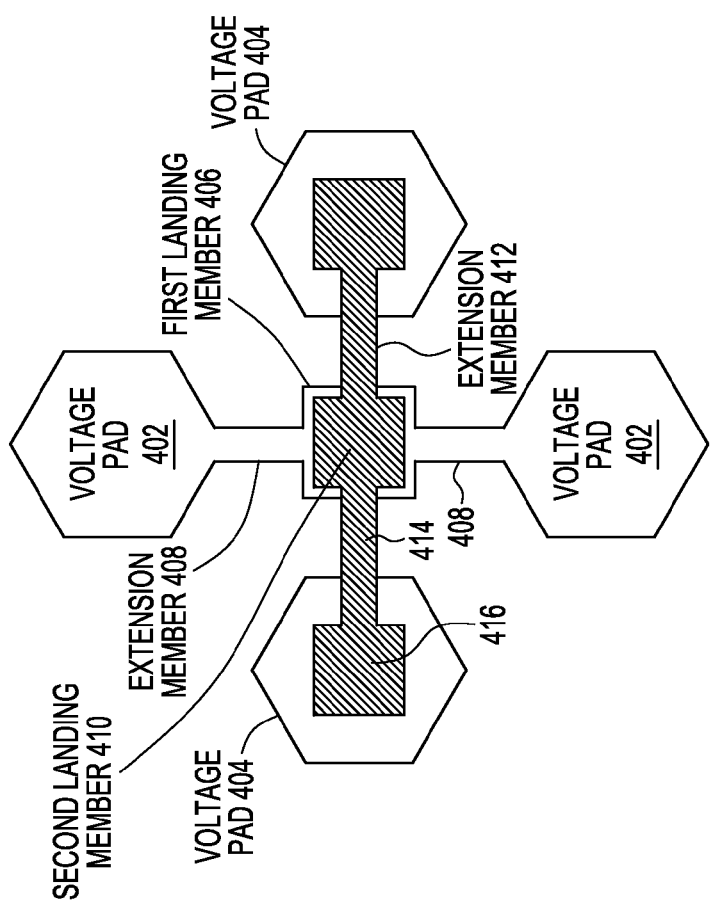
Figure 6:
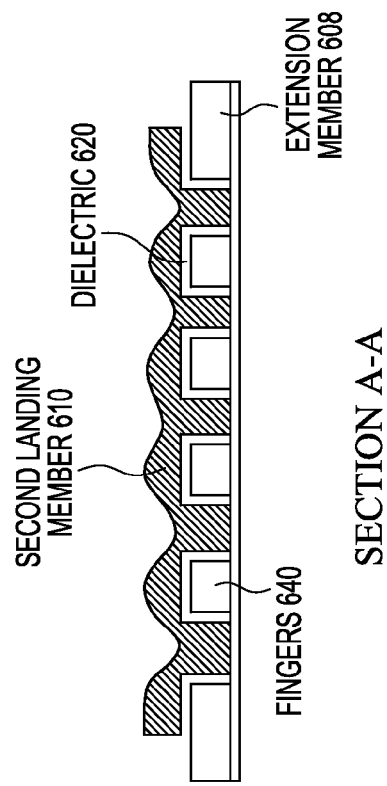
Figure 6:
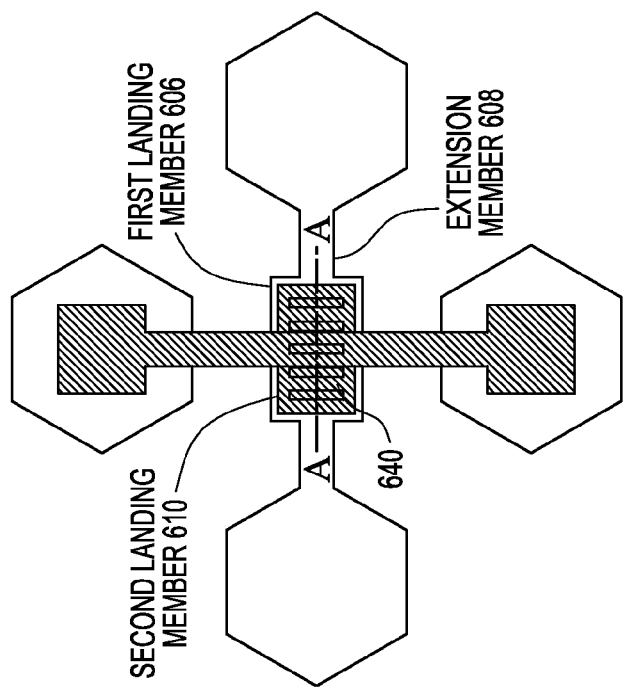

More particularly, FIGS. 4-6 show top-down views of three embedded capacitors 400, 500, and 600 formed in accordance with the present teachings. The embedded capacitors 400, 500, and 600 represent different possible configurations for the embedded capacitor 106 shown in FIG. 1. The embedded capacitors 500 and 600 are similar to the embedded capacitor 400, except for a shape of first and second landing members as explained in further detail below. Therefore, only the details of the components or elements of the embedded capacitor 400 are discussed in detail, the description of which also applies to the embedded capacitors 500 and 600. Moreover, in the figures, including FIGS. 4-6, the phrase bottom electrical conductor is interchangeable with the phrase first electrical conductor; and the phrase top electrical conductor is interchangeable with the phrase second electrical conductor.

The embedded capacitor 400 includes a first electrical conductor having a first landing member 406, a first pair of voltage pads 402, and a first pair of extension members 408 connecting the first landing member 406 to the first pair of voltage pads 402. In an embodiment, the first pair of voltage pads 402 are configured to receive a first voltage level. For example, the voltage pads 402 are two of a plurality of voltage pads that are connected to a voltage common such as ground at about 0 volts (V). Moreover, the first landing member 406, first pair of voltage pads 402, and first pair of extension members 408 are formed in a metal layer of a semiconductor die.

A second electrical conductor of the embedded capacitor 400 includes a second landing member 410 that overlaps the first landing member 406. The second electrical conductor of the embedded capacitor 400 further includes a second pair of voltage pads 404 and a second pair of extension members 412 connecting the second landing member 410 to the second pair of voltage pads 404. The connection between the extension members 412 and the voltage pads 404 cannot be seen in this top-down view. Also, as used herein, overlaps means that at least some portion of the second landing member 410 is coincident with at least some portion of the first landing member 406.

As shown, the entire area of the landing member 410 is coincident with the area of the landing member 406. However, this is not required for proper functioning of the embedded capacitor 400. In a particular embodiment, the areas of the landing members 406 and 410 are the same or substantially the same (within manufacturing tolerances), and what is viewable in FIG. 4 is a dielectric of the embedded capacitor, which surrounds the landing member 406. In addition, as shown, the first and second landing members 406 and 410, respectively, are positioned vertically adjacent to one another in that they are disposed in a stacked configuration, wherein each landing member is formed in a different plane of material within the semiconductor package. However, the landing members 406 and 410 are not directly adjacent because the dielectric is positioned between them.

The second landing member 410 and the second pair of extension members 412 are formed in the metal layer of the package structure. The second pair of voltage pads 404 is formed in the metal layer of the semiconductor die and connected to the pair of extension members 412 during the package build-up process. Moreover, the second pair of voltage pads 404 are configured to receive a second voltage that is different from the first voltage to enable the proper functioning of the embedded capacitor. For example, the second pair of voltage pads 404 includes two of a plurality of voltage pads that are connected to a positive voltage or power source for the semiconductor die. In any event, during operation of the semiconductor package that contains the embedded capacitor 400, there is a voltage differential between the voltage supplied to the voltage pads 402 and the voltage supplied to the voltage pads 404. Additionally, in a particular embodiment, the voltage pads 402 are adjacent ground pads, and the voltage pads 404 are adjacent power pads, which aids in maximizing an amount of capacitance, such as decoupling capacitance, that can be embedded into the semiconductor package within a given die area.

In one implementation scenario, an extension member has a uniform shape from the top-down perspective, such as with the extension members 408. In another implementation scenario, the extension member has a non-uniform cross-sectional shape from the top-down perspective, such as with the extension members 412. In this implementation scenario, the extension member 412 has a narrower portion 414 that connects from the landing member 410 to a wider portion 416 that can provide a better connection to the voltage pads 404 due to the larger surface area. However, all top-down shapes shown in FIG. 4 are only examples.

Additionally, the top-down shapes of the landing members 406 and 410 can be the same or different. Moreover, the top-down shapes of either the landing member 406 or 410 or both can vary. In a particular embodiment, at least one of the first landing member 406 or the second landing member 410 has a geometry that is one of square, octagonal, or fingered. In all examples, the shape of the landing members impacts capacitance. Additionally, as a consequence of the semiconductor manufacturing process, the amount or number of defects may vary throughout the dielectric layer that is used to form the dielectric of embedded capacitors. However, having flexibility in the shape of the landing members provides the ability to tailor the shape of the electrical conductors of the embedded capacitors to maximize the amount of capacitance while avoiding areas of relatively high dielectric defects.

The landing member 406 can further include perimeter-intensive components if desired, as illustrated in and described by reference to FIG. 6; and the thickness of either or both landing members can be varied based on the topographical conformity allowances of the process. Adding or including perimeter intensive components on a landing member increases the surface area of overlay between the two landing members, thereby increasing the total amount of capacitance within a given area, since capacitance is directly related to surface area of the plates of a capacitor. Moreover, a seal ring structure that is placed at the outer edges of a semiconductor die, in some embodiments, can be surrounded by the embedded capacitor's dielectric and a top plate can be formed above this dielectric, thereby adding even more capacitance. A seal ring structure is a metal structure that encapsulates the outer perimeter of a semiconductor die to seal the outer edges of the die after singulation to protect it from environmental damage. The seal ring structure can be used to effectively increase the surface area of the bottom plate of the embedded capacitor to, thereby, increase the capacitance for that embedded capacitor.

FIGS. 4-6 illustrate different shaped landing members. For example, the first and second landing members 406 and 410, respectively, of the embedded capacitor 400 have a top-down shape that is square. In another example shown in FIG. 5, first and second landing members 506 and 510, respectively, of the embedded capacitor 500 have a top-down shape that is octagonal. In a further example shown in FIG. 6, a top-down view on the left shows a first landing member 606 of the embedded capacitor 600 with a plurality of fingers, in this case four with one labeled 640. The fingers are an example of perimeter intensive components that increase the surface area of the first landing member 606 to increase the capacitance of the embedded capacitor 600. A second landing member 610 of the embedded capacitor 600, which overlaps the first landing member 606, has a different shape. In this case, the top-down shape of the second landing member 610 is rectangular having a length and width that can be substantially the same as a length and width of the first landing member 606.

A cross-sectional view on the right illustrates a segment through the embedded capacitor 600 at a line labeled Section A-A. The cross-sectional view shows a dielectric 620 of the embedded capacitor 600 formed over the four fingers 640 and partially over extension members, one of which is labeled 608, of the bottom electrical conductor. The second landing member 610 is then formed over the dielectric 620. In an embodiment, a deposition process is used to deposit at least a portion of the metal layer from which the top electrical conductor is fashioned so that the metal at least partially fills the crevices between the fingers 640. Etching can then be used to shape the edges of the second landing member 610.

Method 200 further includes determining 212 whether additional layers are required for a given packaging implementation. Each additional layer is formed 214 using the package build-up process. For example, multiple metal layers can be deposited to form metal interconnects, and multiple package dielectric layers can be formed to insulate the metal interconnects. After the final package build-up layer is formed and shaped, solder contacts are formed 216 to connect the semiconductor die to an external device using the metal interconnects formed in the one or more metal layers of the package structure. The solder contacts may be formed using any one of several connection techniques. For example, the solder contacts can include, but are not limited to, wire bonds, copper pillars, solder bumps, or the like. In the embodiment where multiple package structures are built on top of multiple die within a semiconductor die panel, the die panel is singulated or cut 218 into multiple semiconductor packages, one or more of which includes at least one embedded capacitor in accordance with the present teachings.

Figure 7:
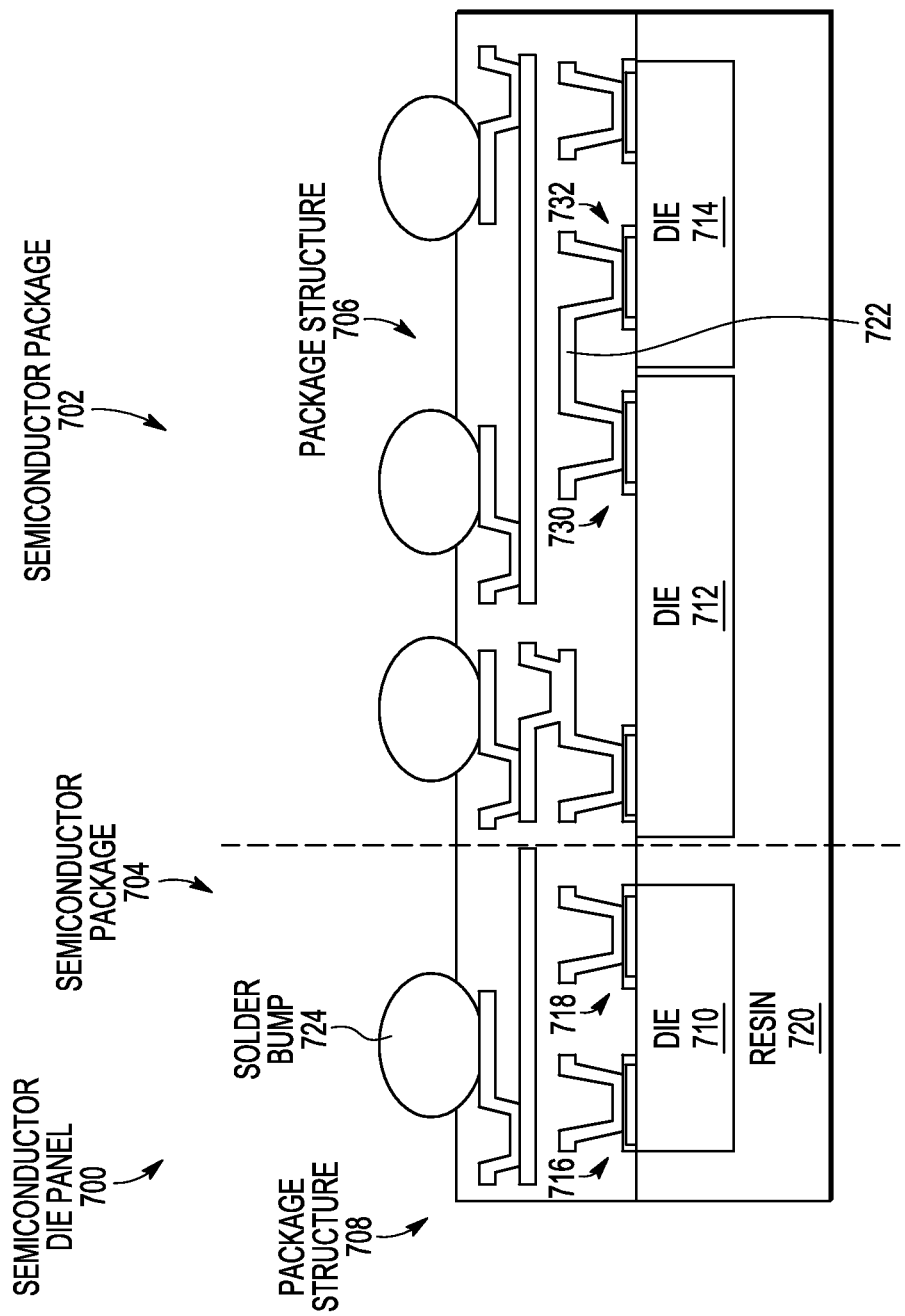
FIG. 7 is a cross-sectional view of part of a semiconductor die panel with multiple semiconductor packages formed therefrom, each including an embedded capacitor in accordance with an embodiment.

FIG. 7 is a cross-sectional view of part or a portion of a semiconductor die panel 700 having multiple semiconductor packages 702 and 704 formed therefrom, each including at least one embedded capacitor in accordance with the present teachings. In an example implementation, the multiple semiconductor packages are manufactured using a method in accordance with an embodiment, for instance in accordance with the method 200 illustrated in FIG. 2 and described above. The vertical dashed line indicates where the structure 700 is cut to separate the semiconductor packages 702 and 704 at the end of the semiconductor package manufacturing process 200.

In one embodiment, the semiconductor die panel 700 is a wafer with multiple die, e.g., 710, 712, 714, that was not singulated before building package structures on the die. However in the embodiment shown in FIG. 7, the semiconductor die panel 700 is a reconstituted die panel, wherein the die 710, 712, and 714 are embedded in a resin 720. The semiconductor package 702 includes multiple die 712 and 714, within the resin 720, having a package structure 706 built or formed thereon using a fan-out wafer level package build-up process. The semiconductor package 704 includes a single die 710, within the resin 720, having a package structure 708 built or formed thereon. Each semiconductor package further includes solder contacts or bumps, with one being indicated at 724.

As illustrated by reference to FIG. 7, the present teachings can be used to embed one or multiple capacitors within a semiconductor package. For example, the semiconductor package 704 includes two such embedded capacitors 716 and 718, wherein one of the plates for each embedded capacitor 716 and 718 is formed in a metal layer of the die 710, while the other plate for each embedded capacitor 716 and 718 is formed in a metal layer of the package structure 708. In another example implementation, a metal connection 722 connects an embedded capacitor 730 formed in the semiconductor die 712 and the package structure 706 with an embedded capacitor 732 formed in the semiconductor die 714 and the package structure 706.

As mentioned above by reference to FIG. 4, the adjacent pads that make up one electrical conductor of an embedded capacitor are configured to receive a different voltage level from the voltage pads that make up the other electrical conductor of the embedded capacitor. For example for the embedded capacitor 716, the plate that is embedded in the die 710 can be formed using a pair of voltage pads coupled to a first voltage level such as ground. Accordingly, the plate for the capacitor 716 that is embedded in the package structure 708 is, thereby, connected to a pair of voltage pads configured to receive another or second voltage level such as a positive voltage or power voltage level. However, the coupling of the voltage pads for another capacitor embedded in the same semiconductor package can be of an opposite configuration.

For example, for the embedded capacitor 718, the plate that is embedded in the die 710 can be formed using a pair of voltage pads coupled to the second or power voltage level, and the plate that is embedded in the package structure 708 would, thereby, be connected to a pair of voltage pads configured to receive the first or ground voltage level. Beneficially, capacitance within a semiconductor package can be easily maximized by using space on a semiconductor die that would not otherwise be used and with minimum changes to existing semiconductor processing technology. Moreover, the dimensions and material compositions used in forming the embedded capacitors as disclosed can be chosen to provide a desired amount of capacitance.

Figure 8:
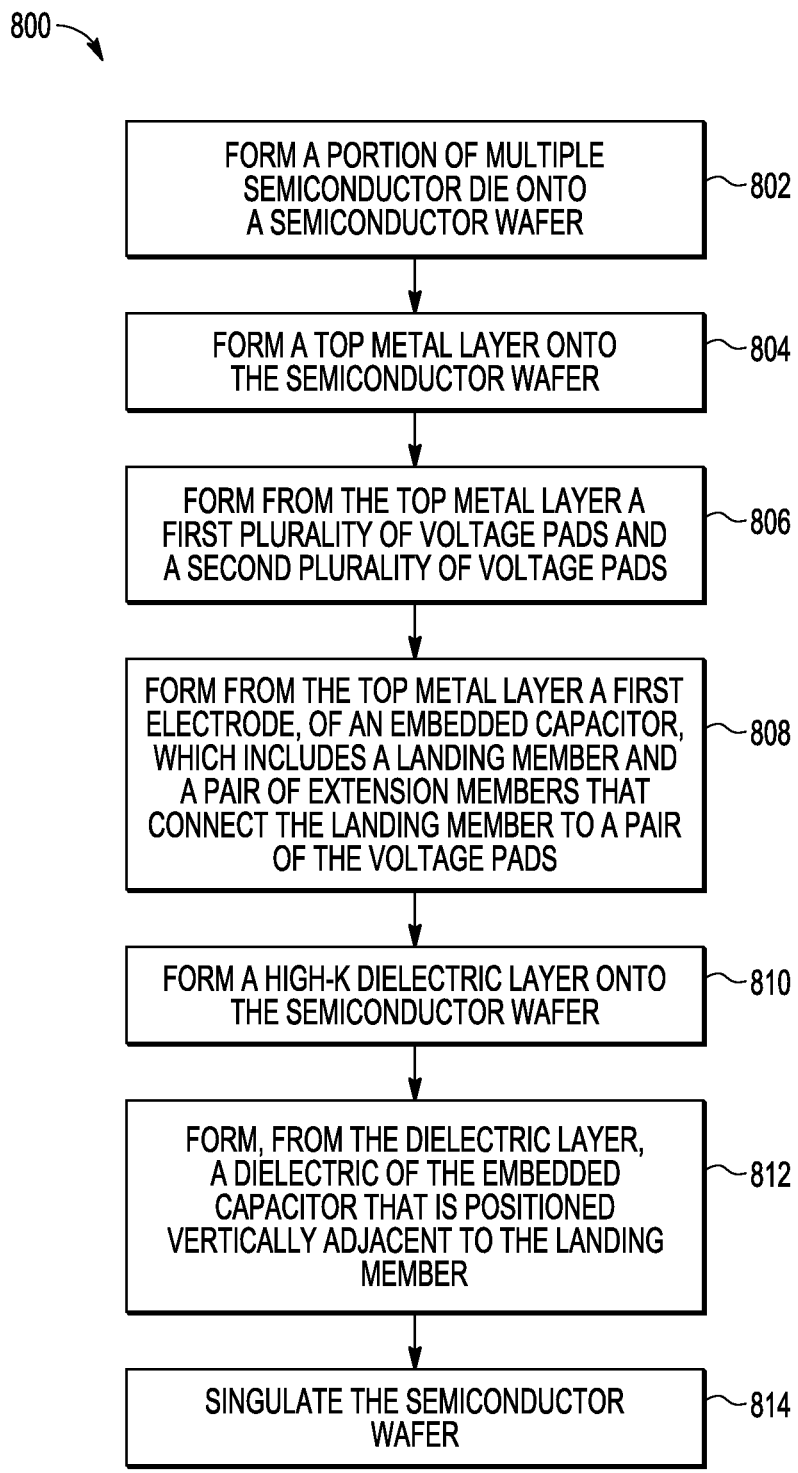
FIG. 8 is a flow diagram illustrating a method of manufacturing a semiconductor die having a portion of an embedded capacitor, in accordance with an embodiment.

FIG. 8 is a flow diagram illustrating a method 800 of manufacturing a semiconductor die, like the die shown FIGS. 1, 3, and 7, having a portion of an embedded capacitor in accordance with an embodiment. In accordance with this particular embodiment, the dielectric of an embedded capacitor is formed from a dielectric layer of the semiconductor die of a semiconductor package. Method 800 can be used to construct multiple die, such as the die shown in FIGS. 3 and 7 that reside on a reconstituted semiconductor die panel, with a portion of an embedded capacitor in accordance with the present teachings. However, in another embodiment, method 800 can be modified, for instance by not implementing blocks 802 and 814 of the method 800, to embed a portion of a capacitor into a single die, such as the die 102 of FIG. 1.

For enabling the embedding of a capacitor portion into one or into multiple die, method 800 begins with forming 802 a portion of multiple semiconductor die onto a semiconductor wafer. For example, any suitable semiconductor die manufacturing front-end-of-line (FEOL) process can be used to create and shape various layers of metal and dielectric materials onto the wafer using various process steps including but not limited to deposition, removal, patterning, and/or modification of electrical properties, to create semiconductor devices such as transistors on the semiconductor wafer.

For forming the embedded capacitor, another metal layer is formed 804 over the wafer. A layer being formed "over" the wafer can include the layer being formed directly on the wafer material or, as in this case, the layer being formed on an intervening layer. The terms "formed on" and "formed over" are used interchangeably herein. In one embodiment, the metal layer is a top metal layer, which is a finally-formed metal layer, of the semiconductor die. A finally-formed metal layer is the metal layer of the semiconductor die that is closest to the package structures. For example, the metal layer is a top layer made at least in part from aluminum. The first plate of the embedded capacitor is formed from this metal layer. Particularly, method 800 includes forming 806 from the top metal layer of the die a first plurality of pads, e.g., ground pads, and a second plurality of pads, e.g., power pads. In one particular manufacturing scenario, these ground and power pads are formed as part of a conventional manufacturing process, and the embedded capacitor is constructed using some of these ground and power pads according to the described embodiments.

In a particular embodiment, forming the plate of the embedded capacitor from the top metal layer includes forming 808 a landing member, e.g., 406 of FIG. 4, and a pair of extension members, e.g., 408 of FIG. 4, that connect the landing member 406 to a pair of the voltage pads, e.g., 402 of FIG. 4, in the first or second plurality of voltage pads. The embedded capacitance can be maximized by using pads already formed as a part of the FEOL processing, which would not otherwise be used.

Method 800 further includes forming 810 a dielectric layer onto the metal layer, e.g., the top metal layer, of the die and thereby onto the first electrical conductor. This processing step is an additional step not performed in conventional semiconductor die processing. In one particular embodiment, the dielectric layer is a high-k dielectric layer that is formed 810 over the semiconductor wafer. Method 800 continues with forming 812, from the dielectric layer, a dielectric of the embedded capacitor. The dielectric layer is shaped, through a patterning process for instance, to position the dielectric vertically adjacent to the landing member that was formed in the top metal layer of the die to isolate the first electrical conductor from a second electrical conductor of the embedded capacitor formed in the package structure of the semiconductor package. This illustrative semiconductor die manufacturing process 800 ends with singulating 814 the semiconductor wafer to separate the multiple semiconductor die. At least some of the singulated die have an electrical conductor and dielectric of at least one embedded capacitor formed and configured in accordance with the teachings herein.

In accordance with a particular embodiment is a semiconductor package having an embedded capacitor. The semiconductor package includes a semiconductor die and a package structure formed on a first side of the semiconductor die. The semiconductor die includes a first metal layer extending across at least a portion of the first side of the semiconductor die, wherein a first electrical conductor of the embedded capacitor is formed in the first metal layer. The package structure includes a second metal layer that has formed therefrom a second electrical conductor of the embedded capacitor. A dielectric of the embedded capacitor is positioned within the semiconductor package to isolate the first electrical conductor from the second electrical conductor.

In accordance with another embodiment, a method of manufacturing a semiconductor package with an embedded capacitor is described. The method includes forming a dielectric layer of a package structure onto a first metal layer of a semiconductor die. The method also includes forming, from the dielectric layer, a dielectric of an embedded capacitor, which is positioned vertically adjacent to a first electrical conductor of the embedded capacitor. The first electrical conductor is formed in the first metal layer of the semiconductor die. The method further includes forming a second metal layer of the package structure onto the dielectric of the embedded capacitor. The method additionally includes forming, from the second metal layer, a second electrical conductor of the embedded capacitor. The second electrical conductor is positioned vertically adjacent to the dielectric of the embedded capacitor.

In accordance with a further embodiment, a method of manufacturing a semiconductor die with a portion of an embedded capacitor is described. The method includes forming a first metal layer of the semiconductor die and forming a first electrical conductor of the embedded capacitor within the first metal layer. The method also includes forming, onto the first metal layer, a dielectric layer of the semiconductor die. The method further includes forming, from the dielectric layer, a dielectric of the embedded capacitor. The dielectric of the embedded capacitor is formed vertically adjacent to the first electrical conductor of the embedded capacitor. The dielectric isolates the first electrical conductor from a second electrical conductor, of the embedded capacitor, which is formed in a package structure for the semiconductor die.

In the foregoing, specific embodiments have been described. However, various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor fabrication may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of manufacturing a semiconductor package with an embedded capacitor, the method comprising:
   forming a dielectric layer of a package structure onto a first metal layer of a semiconductor die;
   forming, from the dielectric layer, a dielectric of the embedded capacitor, wherein the dielectric is positioned vertically adjacent to a first electrical conductor of the embedded capacitor, wherein the first electrical conductor is formed in the first metal layer of the semiconductor die;
   forming a second metal layer of the package structure onto the dielectric of the embedded capacitor;
   forming, from the second metal layer, a second electrical conductor of the embedded capacitor, wherein
      the second electrical conductor is positioned vertically adjacent to the dielectric of the embedded capacitor, and
      said forming the second electrical conductor comprises forming a second landing member and a pair of extension members that connect the second landing member to a pair of voltage pads formed in the first metal layer of the semiconductor die, wherein the second landing member overlaps a first landing member of the first electrical conductor of the embedded capacitor, and the dielectric of the embedded capacitor is between the first and second landing members.

2. The method of manufacturing a semiconductor package of claim 1, wherein forming the dielectric layer comprises forming a high-k dielectric layer.

3. The method of manufacturing a semiconductor package of claim 1, wherein the dielectric layer and the second metal layer are formed as part of a wafer level package build-up process.

4. The method of manufacturing a semiconductor package of claim 3, wherein the wafer level package build-up process is a fan-out wafer level package build-up process.

5. The method of manufacturing a semiconductor package of claim 4, wherein the second metal layer is an initially-formed metal layer of multiple metal layers formed during the fan-out wafer level package build-up process.

* * * * *